United States Patent

Han

(10) Patent No.: US 7,830,742 B2
(45) Date of Patent: Nov. 9, 2010

(54) SEMICONDUCTOR MEMORY DEVICE AND MEMORY CELL ACCESSING METHOD THEREOF

(75) Inventor: Yong-Joo Han, Seongnam-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 316 days.

(21) Appl. No.: 12/007,855

(22) Filed: Jan. 16, 2008

(65) Prior Publication Data

US 2008/0181048 A1 Jul. 31, 2008

(30) Foreign Application Priority Data

Jan. 25, 2007 (KR) .................... 10-2007-0008029

(51) Int. Cl.
*G11C 8/00* (2006.01)

(52) U.S. Cl. ............ 365/230.08; 365/236; 365/230.01; 365/230.02; 365/230.04

(58) Field of Classification Search ................ 365/200, 365/236, 230.1, 185.03, 185.22, 185.24, 365/185.19, 230.01, 230.02, 230.04, 230.08
See application file for complete search history.

(56) References Cited

U.S. PATENT DOCUMENTS

| | | | |
|---|---|---|---|
| 4,716,586 A | 12/1987 | Bauer | |
| 5,479,640 A | 12/1995 | Cartman et al. | |
| 5,715,193 A | 2/1998 | Norman | |
| 5,765,219 A | 6/1998 | Densham et al. | |
| 5,890,105 A | 3/1999 | Ishihara et al. | |
| 5,946,239 A * | 8/1999 | Honma | 365/185.21 |
| 6,035,377 A | 3/2000 | James et al. | |
| 6,070,238 A | 5/2000 | Feiste et al. | |
| 6,157,585 A | 12/2000 | Kim | |
| 6,201,733 B1 | 3/2001 | Hiraki et al. | |
| 6,259,646 B1 | 7/2001 | Huber | |
| 6,345,001 B1 | 2/2002 | Mokhlesi | |
| 6,586,823 B2 | 7/2003 | Ohmura et al. | |
| 6,898,668 B2 | 5/2005 | Thompson | |
| 6,993,690 B1 * | 1/2006 | Okamoto | 714/718 |
| 7,096,341 B1 | 8/2006 | DeTar, Jr. et al. | |
| 7,113,432 B2 | 9/2006 | Mokhlesi | |
| 7,406,576 B2 | 7/2008 | Asauchi | |
| 7,434,122 B2 | 10/2008 | Jo | |
| 7,447,936 B2 | 11/2008 | Shiota et al. | |
| 7,472,252 B2 | 12/2008 | Ben-Zvi | |
| 2002/0097603 A1 * | 7/2002 | Tanaka et al. | 365/185.03 |
| 2006/0092725 A1 | 5/2006 | Min et al. | |

FOREIGN PATENT DOCUMENTS

| | | |
|---|---|---|
| JP | 10-283787 | 10/1998 |
| JP | 2003-059288 | 2/2003 |
| KR | 10-2000-0003987 A | 1/2000 |
| KR | 10-2000-0035149 A | 6/2000 |
| KR | 10-2006-0038667 A | 5/2006 |

* cited by examiner

*Primary Examiner*—Pho M Luu
*Assistant Examiner*—Tha-O Bui
(74) *Attorney, Agent, or Firm*—Lee & Morse, P.C.

(57) ABSTRACT

A memory cell accessing method may include receiving an input address, determining whether the input address has been accessed at least a predetermined number of times, and converting a memory cell enabled by the input address when it is determined that the input address has been accessed the predetermined number of times or more.

14 Claims, 5 Drawing Sheets

SEMICONDUCTOR MEMORY DEVICE AND MEMORY CELL ACCESSING METHOD THEREOF

BACKGROUND OF THE INVENTION

1. Field of the Invention

Embodiments relate to a semiconductor memory device. More particularly, embodiments relate to a method for accessing memory cells of a semiconductor memory device.

2. Description of the Related Art

A semiconductor memory device is a memory device that stores data to be retrieved and read when required. A typical semiconductor memory device includes a cell array and an address decoder. The address decoder selects a corresponding memory cell of the memory cell array in response to an address. However, the reliability of a memory cell in a semiconductor memory device may diminish in accordance with a number of times it is accessed.

SUMMARY OF THE INVENTION

Embodiments are therefore directed to a semiconductor memory device and a method for accessing memory cells thereof, which substantially overcome one or more of the problems due to the limitations and disadvantages of the related art It is a feature of an embodiment of a semiconductor memory device and a method for accessing memory cells thereof that are capable of increasing the reliability of the memory cells.

At least one of the above and other features and advantages of embodiments may be realized by providing methods for accessing a memory cell of a semiconductor memory device. Such methods may include receiving an input address, determining whether the input address has been accessed a predetermined number of times or more, and converting a memory cell enabled by the input address, when it is determined that the input address has been accessed the predetermined number of times.

In some embodiments, the method may further include storing a previously input address in the semiconductor memory device to perform the determining of whether the input address has been accessed the predetermined number of times.

In other embodiments, the semiconductor memory device may store all input addresses.

In still other embodiments, determining whether the input address has been input the predetermined number of times or more may include determining whether the input address is the same as the stored address.

In even other embodiments, the method may further include increasing or decreasing a count when it is determined that the input address is the same as the stored address.

In yet other embodiments, during converting of the memory cell, when the count indicates that the input address has been input the predetermined number of times or more, the semiconductor memory device may convert the memory cell enabled by the input address.

In further embodiments, wherein converting may include accessing another memory cell. In still further embodiments, the another memory cell array may be a in a different memory cell array.

At least one of the above and other features and advantages of embodiments may be realized by providing semiconductor memory devices including a first memory cell array including a first memory cell enabled when an address is input, and a second memory cell array including a second memory cell enabled with the address when the address is input a predetermined number of times or more, wherein the first memory cell is deactivated with the address when the address is input the predetermined number of times.

In some embodiments, the semiconductor memory device may further include a flexible address decoder configured to receive the address that is input, determine whether the address has been input the predetermined number of times or more, and enable the first memory cell or the second memory cell with the address.

In other embodiments, the flexible address decoder may be configured to store addresses, compare the stored addresses to the input address, and determine whether the input address has been accessed the predetermined number of times.

In still other embodiments, the stored addresses may be all input addresses.

In even other embodiments, the flexible address decoder may include a register configured to store a previously input address, a comparer configured to compare whether the stored address is the same as the input address, and a counter configured to increase or decrease a count when a result of the comparison by the comparer indicates that the stored address is the same as the input address, wherein the input address enables the second memory cell when the count indicates the input address has been accessed the predetermined number.

In yet other embodiments, the flexible address decoder may further include a memory cell position converter that enables the first memory cell or the second memory cell, based on a result of the count.

In further embodiments, the register may store a new address when the count indicates that the address that is input has been input the predetermined number of times or more.

In still further embodiments, the second memory cell array may include a redundancy cell.

At least one of the above and other features and advantages of embodiments may be realized by providing semiconductor memory devices including a first memory cell array including a first memory cell activated by a first address, a second memory cell array including a second memory cell activated by a second address, and a flexible address decoder that enables a third memory cell of the second memory cell array instead of the first memory cell of the first memory cell array with the first address when the first address is input a predetermined number of times or more, and enables a fourth memory cell of the first memory cell array instead of the second memory cell of the second memory cell array with the second address when the second address is input a predetermined number of times or more.

In yet other embodiments of the present invention, memory cells may be selectively enabled with data of a mode register set (MRS) command.

In some embodiments, the semiconductor memory device may be a dynamic random access memory (DRAM).

At least one of the above and other features and advantages of embodiments may be realized by providing articles of manufacture having a machine accessible medium including data that, when accessed by a machine, cause the machine to perform methods for accessing a memory cell of a semiconductor memory device, the methods including receiving an input address, determining whether the input address has been accessed a predetermined number of times or more, and converting a memory cell enabled by the input address when it is determined that the input address has been accessed the predetermined number of times or more.

BRIEF DESCRIPTION OF THE DRAWINGS

The above and other features and advantages of embodiments will become more apparent to those of ordinary skill in the art by describing in detail exemplary embodiments thereof with reference to the attached drawings, in which.

DETAILED DESCRIPTION OF THE INVENTION

Figure 1:
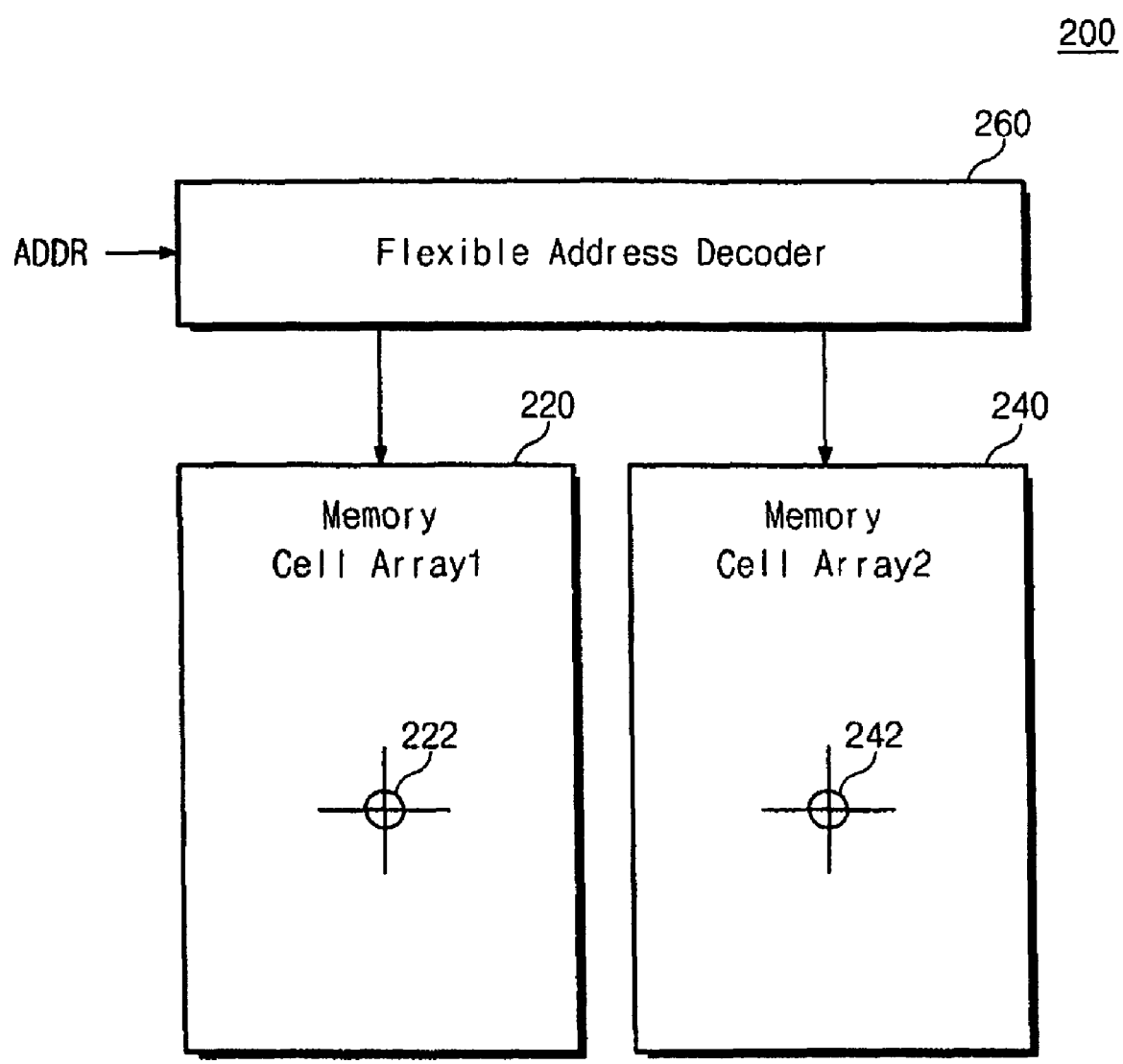
FIG. 1 illustrates a block diagram of a semiconductor memory device according to an embodiment.

Korean Patent Application No. 10-2007-0008029, filed on Jan. 25, 2007, in the Korean Intellectual Property Office, and entitled: "Semiconductor Memory Device and Memory Cell Accessing Method Thereof," is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout.

FIG. 1 illustrates a block diagram of a semiconductor memory device 200 according to an embodiment. Referring to FIG. 1, a semiconductor memory device 200 may include a first memory cell array 220, a second memory cell array 240, and a flexible address decoder 260.

The flexible address decoder 260 may convert accessing of a certain memory cell 222 of the first memory cell array 220 (when it is accessed a predetermined number of times or more) to a certain memory cell 242 of the second memory cell array 240 having a corresponding address (ADDR). Here, the ADDR may be a row address or a column address.

The memory cell arrays 220 and 240 may include various types of memory cells, depending on the type of semiconductor memory device 200. Here, the first and second memory cell arrays 220 and 240 are typical memory cell arrays. The second memory cell array 240 may include new memory cells, e.g., the memory cell 242, accessed according to addresses ADDR when memory cells, e.g., the memory cell 222, of the first memory cell array 220 have been accessed a predetermined number of times or more.

The first memory cell array 220 may include memory cells that are accessed according to the address ADDR when a memory cell of the second memory cell array 240 is accessed a predetermined number of times or more. That is, when a memory cell of either the memory cell array 220 or 240 is accessed a predetermined number of times or more, the accessed memory cell may be converted to one in the other memory cell array according to address.

The memory cell arrays may be a dynamic random access memory (DRAM), an electrically erasable programmable read-only memory (EEPROM), a flash memory, etc. The memory cells may be selectively enabled, e.g., with data of a mode register set command (MRS).

The semiconductor memory device 200 may control the addresses that are input, and may prevent a memory cell from being accessed a predetermined number of times or more. Accordingly, the memory cell 222 of the memory cell array 220 may be made more reliable.

Figure 2:
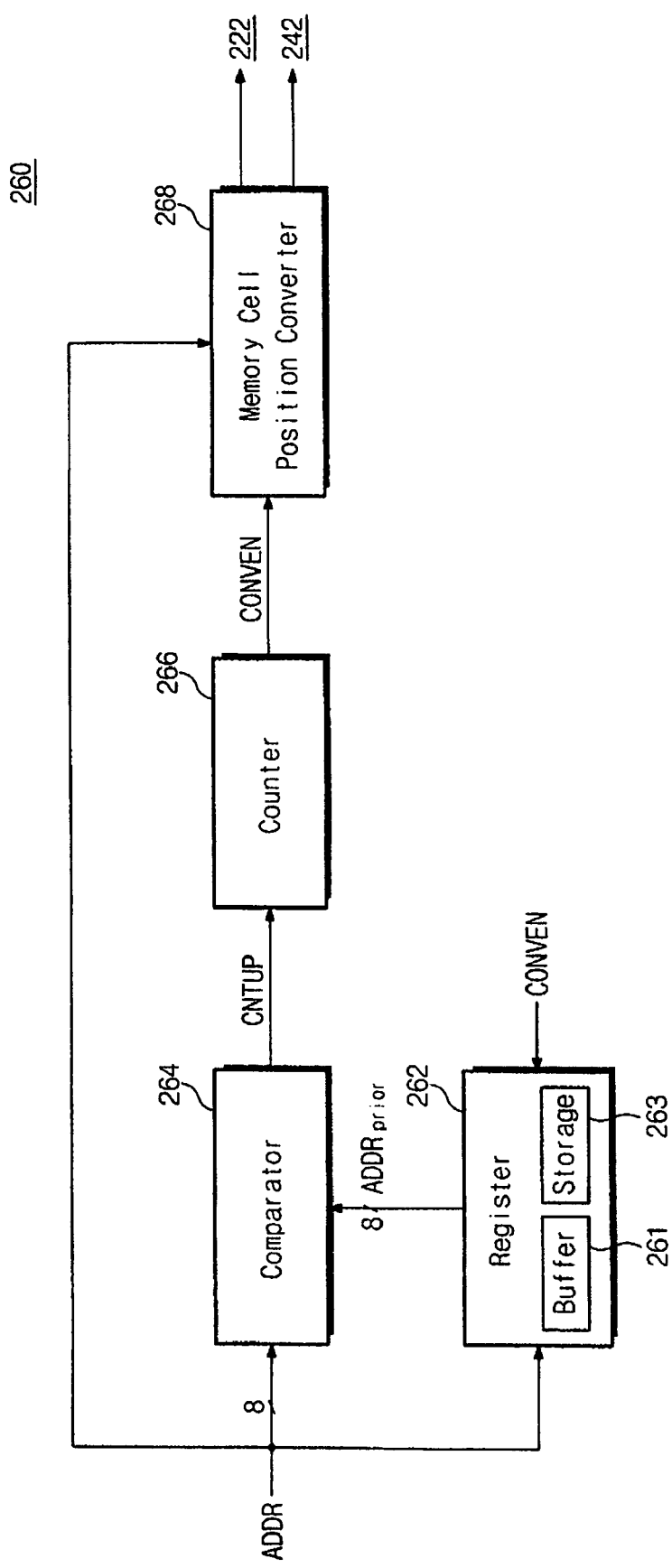
FIG. 2 illustrates a block diagram of the flexible address decoder in FIG. 1 according to an embodiment.

FIG. 2 illustrates a block diagram of the flexible address decoder 260 in FIG. 1 according to an embodiment. Referring to FIG. 2, the flexible address decoder 260 may include a register 262, a comparator 264, a counter 266, and a memory cell position converter 268. The flexible address decoder 260 may compare a prior accessed address (ADDRprior) with an input ADDR, and determines whether to convert a memory cell corresponding to the ADDR.

A process of converting memory cells will be described below with reference to FIG. 2. An ADDR of m-bits is input to the semiconductor memory device 200. Here, for the sake of descriptive convenience, the number 'm' will be designated as '8'. The ADDR is input to the comparator 264 and the register 262.

The register 262 may store the ADDRprior in storage 263. The ADDRprior may be an initially stored address value, i.e., a certain memory cell 222 in the memory cell array 220, when the semiconductor memory device 200 begins operation. A buffer 261 may temporarily store addresses input to the semiconductor memory device 200. Here, when the input ADDR is the same as the ADDRprior stored in the storage 263, the buffer 261 does not store the ADDR. When the certain memory cell 222 has been accessed a predetermined number of times or more, the position of the memory cell may be converted. When the position is converted, the storage 263 stores the ADDR stored in the buffer 261.

In particular, the comparator 264 may determine whether the ADDRprior from the register 262 and the ADDR are the same. If the newly input ADDR is the same as the ADDRprior stored in the register 262, the comparator 264 outputs a count up signal (CNTUP) in a logic 'high' level. If not, the comparator 264 outputs the CNTUP in a logic 'low' level.

The counter 266 responds to the CNTUP and performs counting. When the counter 266 reaches a predetermined number Max or more, a memory cell access enable signal CONVEN may be output in a logic 'high' level. If the number Max is not reached, the counter 266 outputs the CONVEN in a logic 'low' level. The counter 266 may include a non-volatile memory (not illustrated) that stores a value of the counted number of times the ADDR has been accessed. Alternatively, the counter may store the predetermined number Max and may subtract from this value in response to the CNTUP until zero or less is reached.

The memory cell position converter 268 may receive the CONVEN from the counter 266 and determine whether to change a corresponding memory cell access. Here, the memory cell position converter 268 may perform an address decoding function as well. When the CONVEN goes to a logic 'high' level, the memory cell position converter 268 receives a corresponding ADDR to convert memory cells so as to enable a memory cell 242 of the second memory cell array 240. If the CONVEN goes to a logic 'low' level, the memory cell position converter 268 receives a corresponding ADDR to enable access to the certain memory cell 222 of the first memory cell array 220.

Figure 3:
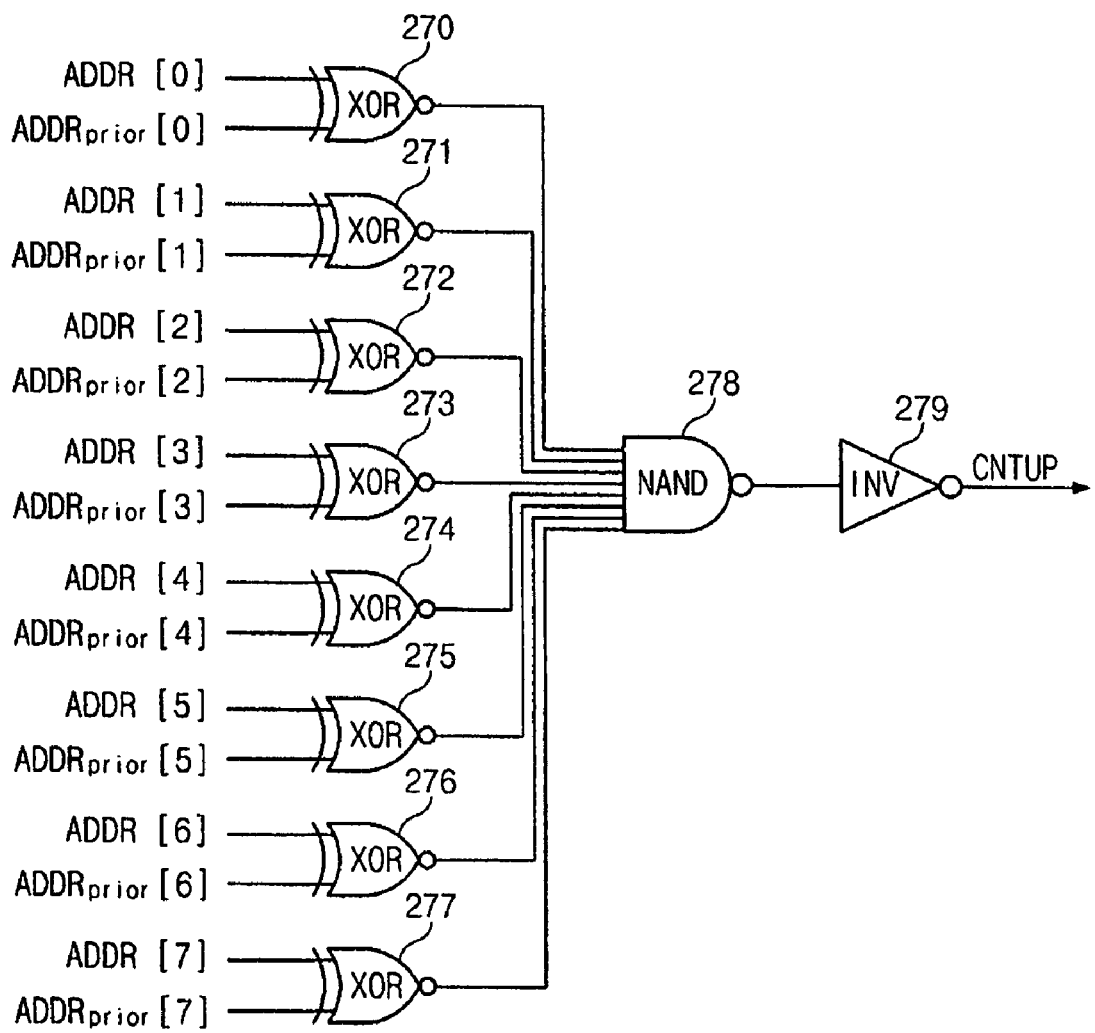
FIG. 3 illustrates a block diagram of the address comparator in FIG. 2 according to an embodiment.

FIG. 3 illustrates a block diagram of the address comparator 264 in FIG. 2 according to an embodiment. Referring to FIG. 3, the comparator may include seven (7) exclusive disjunction (XOR) logic circuits 270-277, a not and (NAND) logic circuit 278, and an inverter 279.

The XOR logic circuits 270-277 may receive the individually input current addresses ADDR and the prior address ADDRprior stored in the register 262 bit-by-bit, and calculate an XOR. The NAND logic circuit 278 performs a NAND logic operation on the values output from each XOR logic circuit 270-277 and relays the results to the inverter 279. The inverter 279 inverts the values output from the NAND logic circuit 278 and generates a CNTUP. Here, the CNTUP may be a logic 'high' level only when all the addresses input to the XOR logic circuits 270-277 are the same.

Only one ADDRprior is illustrated as being stored in the register 262 of the present embodiments. However, embodiments are not limited thereto. The register 262 may store a plurality of addresses. The comparator 264 may determine whether an ADDR is the same as one of the plurality of addresses and generate a corresponding CNTUP.

The register 262 may also store the final address input when a predetermined number Max of accesses is reached or exceeded and there is a physical conversion of addresses.

When a certain memory cell has been accessed a predetermined number or more, the semiconductor memory device 200 may convert the accessing location to another memory cell, e.g., in another memory cell array. Thus, the semiconductor memory device 200 may increase the reliability of memory cells therein.

Similarly, when a certain memory cell of the second memory cell array 240 has been accessed a predetermined number of times or more, the semiconductor memory device 200 may convert the accessed memory cell to a memory cell in the first memory cell array 220.

Figure 4:
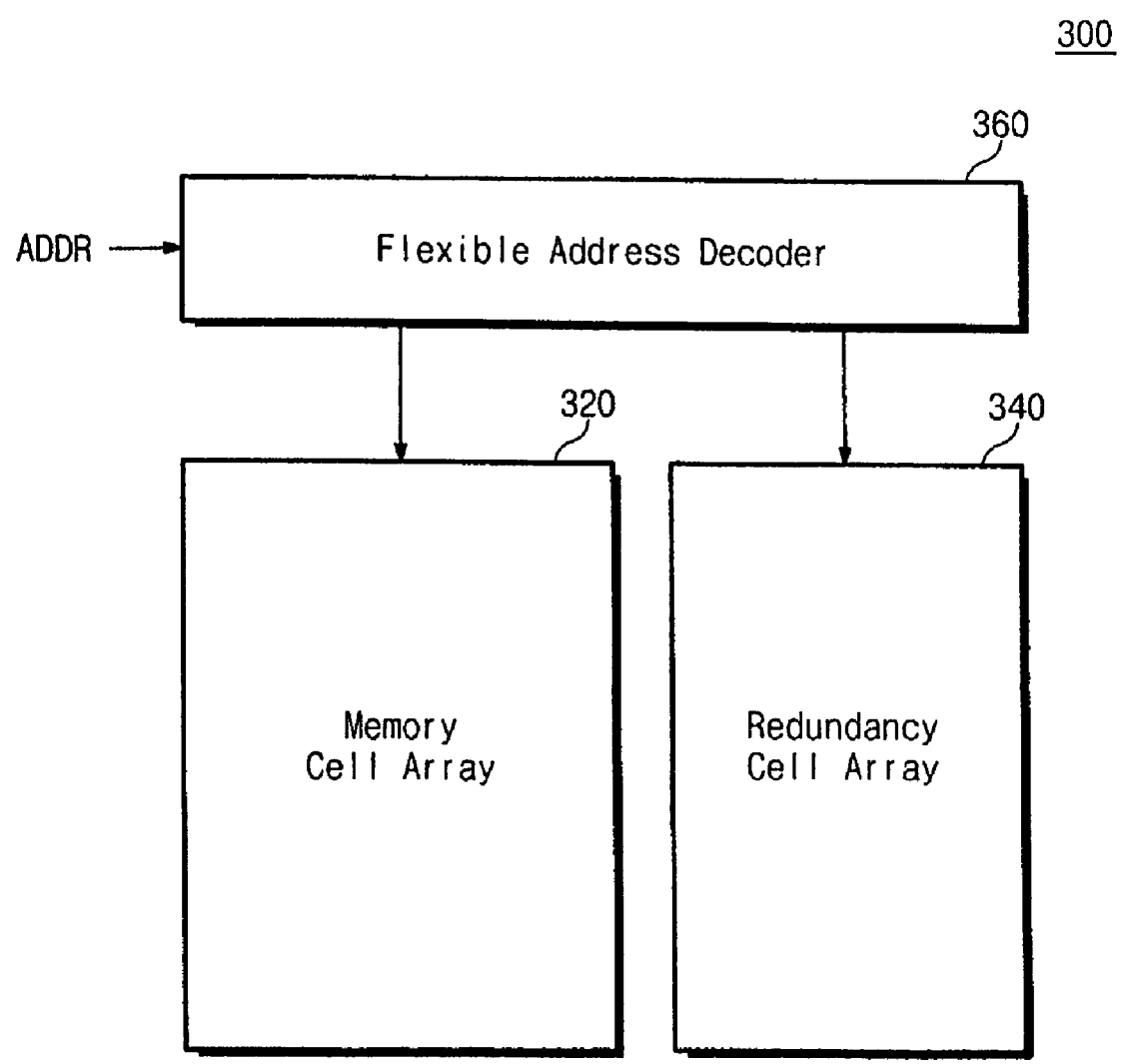
FIG. 4 illustrates a block diagram of another semiconductor memory device according to an embodiment.

FIG. 4 illustrates a block diagram of a semiconductor memory device 300 an embodiment. Referring to FIG. 4, the semiconductor memory device 300 may include a memory cell array 320, a redundancy cell array 340, and a flexible address decoder 360.

The semiconductor memory device 300 may convert an accessed memory cell to a memory cell in the redundancy cell array 340 if a certain cell in the memory cell array 320 is accessed a predetermined number of times or more. Here, the flexible address decoder 360 may be the same as the flexible address decoder 260 described with reference to FIG. 1.

Figure 5:
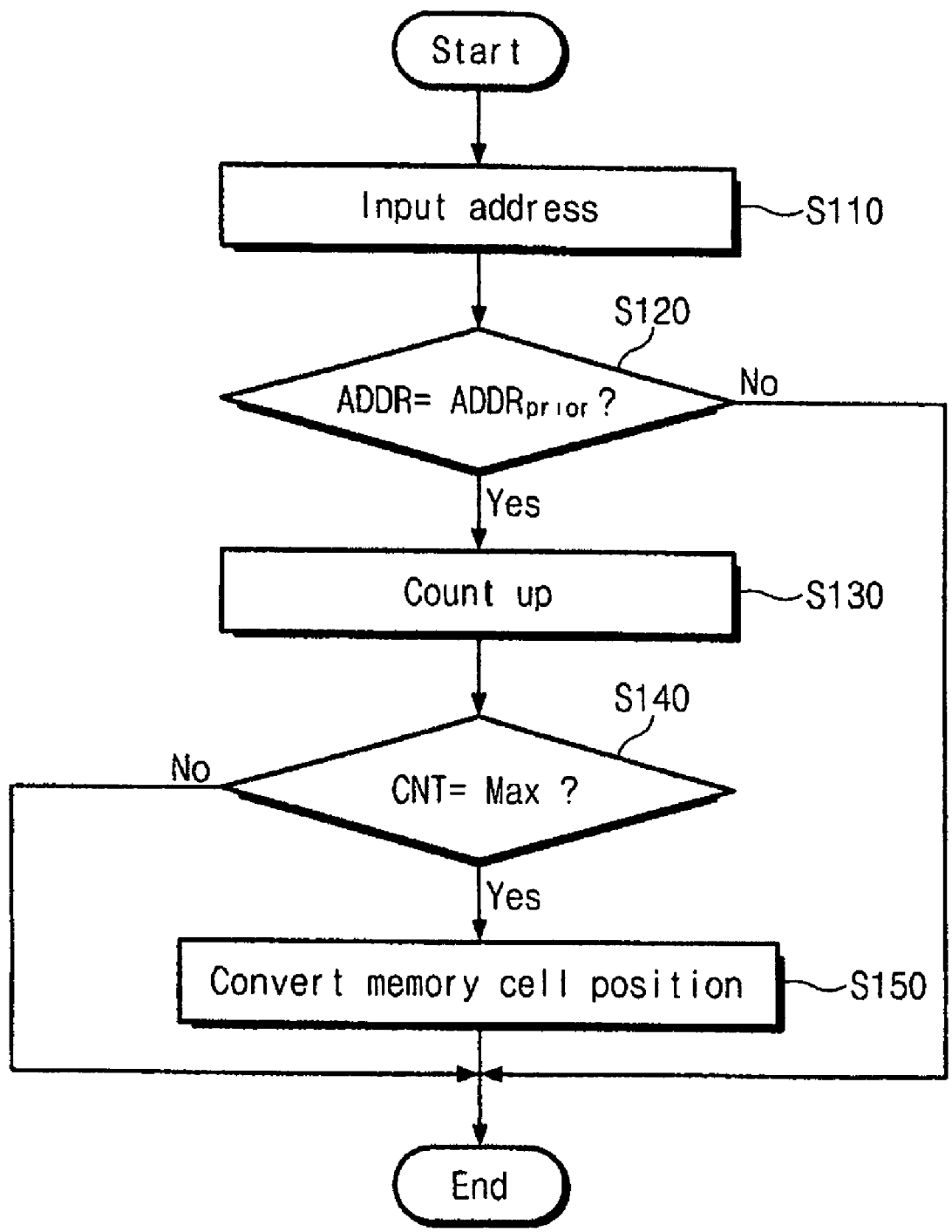
FIG. 5 illustrates a flowchart of a method for accessing a memory cell of a semiconductor memory device according to an embodiment.

FIG. 5 illustrates a flowchart of a method for converting an address according to the present invention. An address converting method will be described below with reference to FIGS. 1, 2, and 5.

In operation S110, the ADDR is input to the semiconductor memory device 200. The ADDR is a predetermined bit value. The input ADDR is relayed to the register 262 and comparator 264.

In operation S120, the comparator 264 may determine whether the currently input ADDR is the same as an ADDRprior stored in the register 262. If the addresses are the same, the comparator 264 may output the CNTUP as a logic 'high' level. If the addresses are the same, the comparator 264 may output the CNTUP as a logic 'low' level.

In operation S130, the counter 266 receives the CNTUP from the comparator 264. When the CNTUP is a logic 'low' level, a count value CNT is maintained, i.e., unchanged. When the CNTUP is a logic 'high' level, the CNT is increased.

In operation S140, the counter 266 determines whether the CNT is equal to or more than a predetermined value Max. If CNT is less than Max, the counter 266 outputs a CONVEN in a logic 'low' level and relays it to the memory cell position converter 268. If CNT is greater than or equal to Max, the counter 266 outputs a CONVEN in a logic 'high level and relays it to the memory cell position converter 268.

In operation S150, the memory cell position converter 268 responds to the CONVEN. When the memory cell position converter 268 receives the CONVEN in a logic 'high' level, the memory cell position converter 268 may convert the accessed memory cell from the memory cell corresponding to the address ADDR, e.g., a memory cell 222 of the first memory cell array 220, to another memory cell, e.g., a memory cell 242 of the second memory cell array 240. When the memory cell position converter 268 receives the CONVEN in a logic 'low' level, the memory cell 222 in the first memory cell array 220 is allowed to be accessed.

As described above, the semiconductor memory device and the method of accessing its memory cells according to the present invention may improve the reliability of memory cells. In particular, according to embodiments, reliability of the memory cells may be improved by employing a flexible address decoder that determines the number of times that addresses are input, and converts an accessed memory cell to another memory cell when the accessed memory cell is accessed a predetermined number of times or more.

Exemplary embodiments of the present invention have been disclosed herein, and although specific terms are employed, they are used and are to be interpreted in a generic and descriptive sense only and not for purpose of limitation. For example, the method of accessing a memory cell may be implemented in software, e.g., by an article of manufacture having a machine-accessible medium including data that, when accessed by a machine, cause the machine to perform a method for accessing a memory cell of a semiconductor memory. Accordingly, it will be understood by those of ordinary skill in the art that various changes in form and details may be made without departing from the spirit and scope of the present invention as set forth in the following claims.

What is claimed is:

1. A method for accessing a memory cell of a semiconductor memory device, the method comprising:
   receiving an input address;
   determining whether the input address has been accessed at least a predetermined number of times; and
   converting a position of the memory cell enabled by the input address when it is determined that the input address has been accessed the predetermined number of times or more, wherein:
   determining of whether the input address has been accessed the predetermined number of times or more includes:
   storing a previously input address in a register of the semiconductor memory device as a stored address,
   determining whether the input address is the same as the stored address, and
   increasing or decreasing a counter when the input address is the same as the stored address; and
   when the counter indicates that the input address has been accessed the predetermined number of times or more, the semiconductor memory device converts the position of the memory cell enabled by the input address from a position of a first memory cell to a position of a second memory cell.

2. The method as claimed in claim 1, wherein storing includes storing all received addresses.

3. The method as claimed in claim 1, wherein the second memory cell is in a different memory cell array.

4. The method as claimed in claim 1, wherein converting the position of the memory cell enabled by the input address includes deactivating the first memory cell and activating the second memory cell to be enabled by the input address.

5. A semiconductor memory device, comprising:
- a first memory cell array including a first memory cell, the first memory cell being enabled when an input address is received;
- a second memory cell array including a second memory cell, the second memory cell being enabled with the input address when the input address has been accessed at least a predetermined number of times, and the first memory cell being deactivated when the input address has been accessed the predetermined number of times; and
- a flexible address decoder including:
  - a register configured to store a previously input address,
  - a comparer configured to compare whether the previously input address stored in the register is the same as the input address, and
  - a counter configured to increase or decrease a count when a result of the comparison by the comparer indicates that the previously input address stored in the register is the same as the input address, the input address enabling the second memory cell when the count indicates the input address has been accessed the predetermined number.

6. The semiconductor memory device as claimed in claim 5, wherein the flexible address decoder is configured to receive the input address, determine whether the input address has been accessed the predetermined number of times, and enable the first memory cell or the second memory cell with the input address.

7. The semiconductor memory device as claimed in claim 6, wherein the flexible address decoder is configured to store a plurality of previously input addresses.

8. The semiconductor memory device as claimed in claim 7, wherein the flexible address decoder is configured to store all previously input addresses.

9. The semiconductor memory device as claimed in claim 5, wherein the flexible address decoder further comprises a memory cell position converter configured to enable the first memory cell or the second memory cell, based on a result of the count.

10. The semiconductor memory device as claimed in claim 9, wherein the register is configured to access another memory cell.

11. The semiconductor memory device as claimed in claim 10, wherein the another memory cell is in a different memory cell array.

12. The semiconductor memory device as claimed in claim 5, wherein the semiconductor memory device is a dynamic random access memory (DRAM).

13. A semiconductor memory device, comprising:
- a first memory cell array including a first memory cell, the first memory cell being activated by a first address;
- a second memory cell array including a second memory cell, the second memory cell being activated by a second address; and
- a flexible address decoder configured to enable a third memory cell of the second memory cell array instead of the first memory cell of the first memory cell array with the first address when the first address is input a predetermined number of times or more, and to enable a fourth memory cell of the first memory cell array instead of the second memory cell of the second memory cell array with the second address when the second address is input a predetermined number of times or more.

14. The semiconductor memory device as claimed in claim 13, wherein memory cells are selectively enabled with data of a mode register set (MRS) command.

* * * * *